US011129306B1

(12) United States Patent
Chen et al.

(10) Patent No.: US 11,129,306 B1
(45) Date of Patent: Sep. 21, 2021

(54) FLUID DISTRIBUTION APPARATUS AND FLUID DISTRIBUTION MODULE WITH CHOKE

(71) Applicant: Wistron Corporation, New Taipei (TW)

(72) Inventors: Hua Chen, New Taipei (TW); Sheng-Yen Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/919,080

(22) Filed: Jul. 1, 2020

(30) Foreign Application Priority Data

Apr. 10, 2020 (TW) ................................. 109112239

(51) Int. Cl.
*H05K 7/20* (2006.01)
*F28F 9/02* (2006.01)
(Continued)

(52) U.S. Cl.
CPC ........ *H05K 7/20781* (2013.01); *F16L 41/025* (2013.01); *F16L 41/03* (2013.01);
(Continued)

(58) Field of Classification Search
CPC .................. F28F 9/0214; F28F 9/0217; Y10T 137/87539; Y10T 137/87265; H05K 7/20836; H05K 7/20781; H05K 7/20736; H05K 7/20272; H05K 7/20763; H05K 7/20145; H05K 7/20327; H05K 7/20709;
(Continued)

(56) References Cited

U.S. PATENT DOCUMENTS 5,901,037 A * 5/1999 Hamilton .................. F28F 3/12
165/80.4
2014/0069610 A1* 3/2014 Arino .................. F28D 1/05366
165/71
(Continued)

FOREIGN PATENT DOCUMENTS

| JP | H10170188 | 6/1998 |
| JP | 2002162178 | 6/2002 |
| TW | M583671 | 9/2019 |

OTHER PUBLICATIONS

"Office Action of Taiwan Counterpart Application", dated Dec. 18, 2020, p. 1-p. 10.

*Primary Examiner* — Atif H Chaudry
(74) *Attorney, Agent, or Firm* — JCIPRNET

(57) ABSTRACT

A fluid distribution apparatus and a fluid distribution module with choke are provided. The fluid distribution apparatus includes a first fluid conveying pipe, a second fluid conveying pipe, multiple fluid manifolds located between the first fluid conveying pipe and the second fluid conveying pipe and connected with the first fluid conveying pipe and the second fluid conveying pipe, an inlet disposed on a side of the first fluid conveying pipe and between both ends of the first fluid conveying pipe; and an outlet disposed on a side of the second fluid conveying pipe and set corresponding to a position where the inlet is set. The fluid is supplied from the inlet to the first fluid conveying pipe, and the fluid is conveyed to the fluid manifolds along the first fluid conveying pipe, and flows into the second fluid conveying pipe through the fluid manifolds and flows out from the outlet.

15 Claims, 13 Drawing Sheets

(51) Int. Cl.
  *F16L 41/03* (2006.01)
  *F16L 55/027* (2006.01)
  *F16L 41/02* (2006.01)

(52) U.S. Cl.
  CPC .......... *F16L 55/027* (2013.01); *F28F 9/0214* (2013.01); *F28F 9/0217* (2013.01); *H05K 7/20627* (2013.01); *Y10T 137/87265* (2015.04); *Y10T 137/87539* (2015.04)

(58) Field of Classification Search
  CPC ........... H05K 7/20645; H05K 7/20572; H05K 7/20627
  See application file for complete search history.

(56) References Cited

U.S. PATENT DOCUMENTS

| | | | |
|---|---|---|---|
| 2014/0352352 A1* | 12/2014 | Hong | F28F 1/32 62/498 |
| 2016/0183409 A1* | 6/2016 | Zhou | H05K 7/20927 361/699 |
| 2018/0135901 A1* | 5/2018 | Hirai | H05K 7/20781 |
| 2019/0104646 A1* | 4/2019 | So | H05K 7/20645 |
| 2020/0103183 A1* | 4/2020 | Todoroki | F28D 7/0066 |

* cited by examiner

FLUID DISTRIBUTION APPARATUS AND FLUID DISTRIBUTION MODULE WITH CHOKE

CROSS-REFERENCE TO RELATED APPLICATION

This application claims the priority benefit of Taiwan application serial no. 109112239, filed on Apr. 10, 2020. The entirety of the above-mentioned patent application is hereby incorporated by reference herein and made a part of this specification.

BACKGROUND

Field of the Disclosure

The disclosure relates to a distribution mechanism, and particularly to a fluid distribution apparatus and a fluid distribution module with choke.

Description of Related Art

With the rapid development of technology, especially in the era with significantly increased demand for network, artificial intelligence, and cloud services, the amount of data that the data center needs to process is getting larger. In order to maintain or improve the processing efficiency of the data center, it is necessary to continuously and effectively dissipate heat from the data center. However, due to the high power density of the data center, the heat generated is massive, and conventional heat dissipation methods are performed by increasing power or scale, but such an approach is highly energy-consuming, and has significantly increased costs and impact on the environment.

SUMMARY OF THE DISCLOSURE

The fluid distribution apparatus of the disclosure includes: a first fluid conveying pipe; a second fluid conveying pipe; a plurality of fluid manifolds, respectively located between the first fluid conveying pipe and the second fluid conveying pipe, and respectively connected to the first fluid conveying pipe and the second fluid conveying pipe; an inlet provided on a side of the first fluid conveying pipe and located between both ends of the first fluid conveying pipe; and an outlet provided on a side of the second fluid conveying pipe and disposed corresponding to the position where the inlet is disposed, wherein the fluid is supplied from the inlet to the first fluid conveying pipe, and the fluid is delivered to the fluid manifold along the first fluid conveying pipe, flows into the second fluid conveying pipe through the fluid manifold, and flows out from the outlet.

In an embodiment of the disclosure, the fluid distribution apparatus is disposed on one side of the rack.

In an embodiment of the disclosure, the inlet is located between two adjacent fluid manifolds.

In an embodiment of the disclosure, the fluid distribution apparatus further includes: an inflow guiding device, which is provided with an inlet, and includes a plurality of first flow-guiding holes, wherein the first flow-guiding holes are respectively connected with the first fluid conveying pipe, the fluid flowing in from the inlet respectively flows into the first fluid conveying pipe through the first flow-guiding holes; and an outflow guiding device provided with an outlet, and includes a plurality of second flow-guiding holes, wherein the second flow-guiding holes are respectively connected with the second fluid conveying pipe, and the fluid flowing out of the second fluid conveying pipe respectively flows into the outlet through the second flow-guiding holes.

In an embodiment of the disclosure, the number of the first flow-guiding holes is at least three, which are respectively disposed at both ends of the first fluid conveying pipe and a position between the both ends.

In an embodiment of the disclosure, the number of the second flow-guiding holes is at least three, which are respectively disposed at both ends of the second fluid conveying pipe and a position between the both ends.

In an embodiment of the disclosure, one of the first flow-guiding holes adjacent to the uppermost fluid manifold and one of the second flow-guiding holes adjacent to the uppermost fluid manifold are respectively spaced apart from the uppermost fluid manifold at a distance larger than or equal to 5D, wherein D is the inner diameter dimension of the fluid manifold. Another first flow-guiding hole adjacent to the lowest fluid manifold and one of the second flow-guiding holes adjacent to the lowest fluid manifold are respectively spaced apart from the lowest fluid manifold at a distance larger than or equal to 5D.

In an embodiment of the disclosure, the cross-sectional area A of the inflow guiding device and the outflow guiding device each is larger than or equal to $(5D)^2$, and D is the inner diameter dimension of the fluid manifold.

In an embodiment of the disclosure, the first end of each of the fluid manifolds is connected with the first fluid conveying pipe, and the second end of each of the fluid manifolds is connected with the second fluid conveying pipe.

In an embodiment of the disclosure, the fluid distribution apparatus further includes: a baffle, disposed at the inlet to reduce the flow rate of the fluid.

In an embodiment of the disclosure, the shape of the baffle is one of a rectangular, a circular and a square shape.

In an embodiment of the disclosure, the area of the baffle is one third of the area of the inlet.

The fluid distribution module with choke of the disclosure includes: a fluid conveying pipe, at least two fluid manifolds, and a choke. The fluid conveying pipe is connected to the at least two fluid manifolds and choke pipelines respectively.

DESCRIPTION OF EMBODIMENTS

Figure 1:
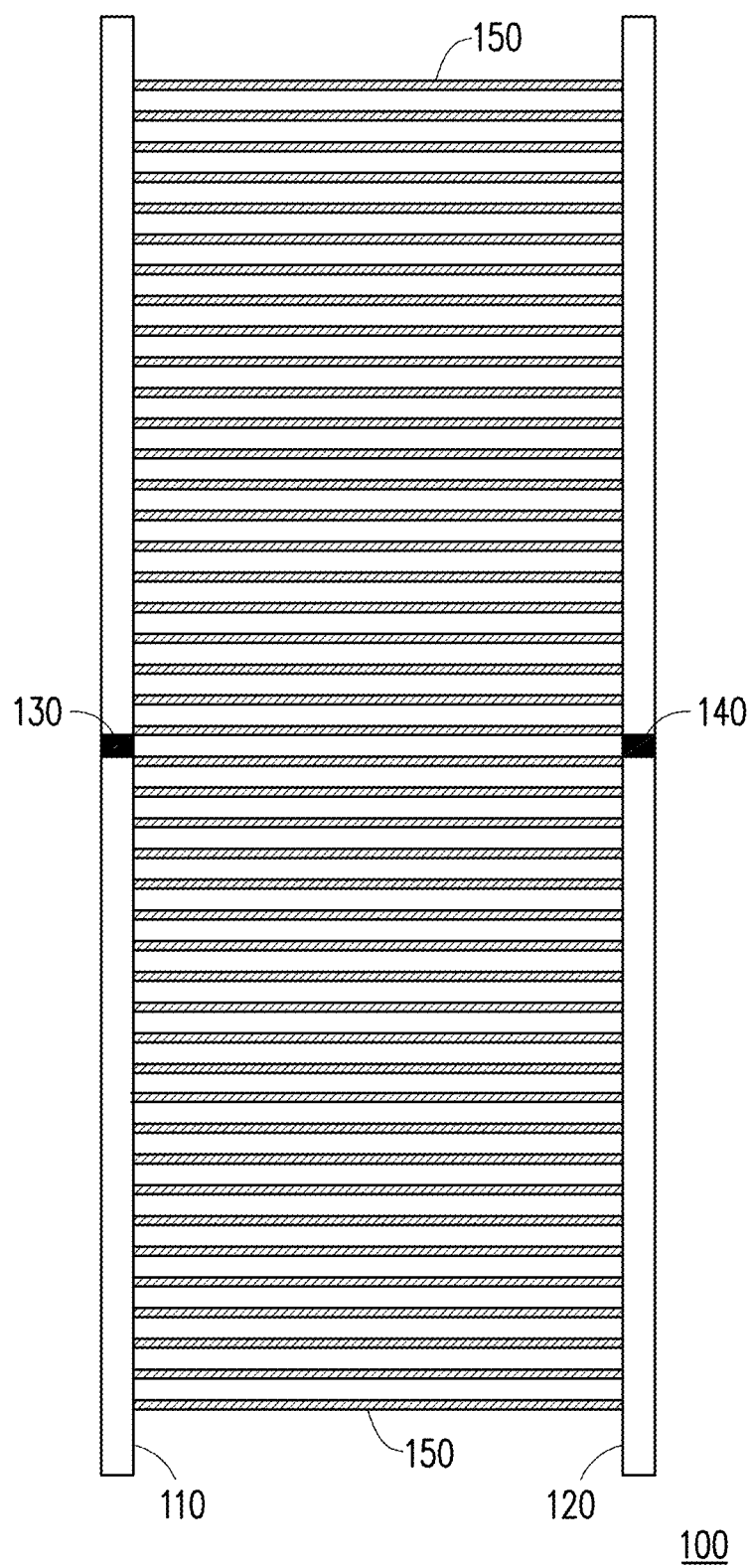
FIG. 1 is a schematic view of a fluid distribution apparatus according to a first embodiment of the disclosure.

FIG. 1 is a schematic view of a fluid distribution apparatus according to a first embodiment of the disclosure. Referring to FIG. 1, the fluid distribution apparatus 100 includes a first fluid conveying pipe 110, a second fluid conveying pipe 120, an inlet 130, an outlet 140, and a plurality of fluid manifolds 150. The fluid manifolds 150 are respectively located between the first fluid conveying pipe 110 and the second fluid conveying pipe 120, and respectively connected with the first fluid conveying pipe 110 and the second fluid conveying pipe 120. That is, the first end of each of the fluid manifolds 150 is connected with the first fluid conveying pipe 110, and the second end of each of the fluid manifolds 150 is connected with the second fluid conveying pipe 120.

The inlet 130 is provided on a side of the first fluid conveying pipe 110 and located between both ends of the first fluid conveying pipe 110. The outlet 140 is provided at a side of the second fluid conveying pipe 120, and is set corresponding to the position where the inlet 130 is provided. That is, the positions of the inlet 130 and the outlet 140 are symmetric.

In this embodiment, preferably the inlet 130 is provided in the center of the first fluid conveying pipe 110 and the outlet 140 is provided in the center of the second fluid conveying pipe 120. However, in other embodiments, the inlet 130 and the outlet 140 may be disposed at a position closer to the upper end or at a position closer to the lower end, which is not limited herein.

Figure 2:
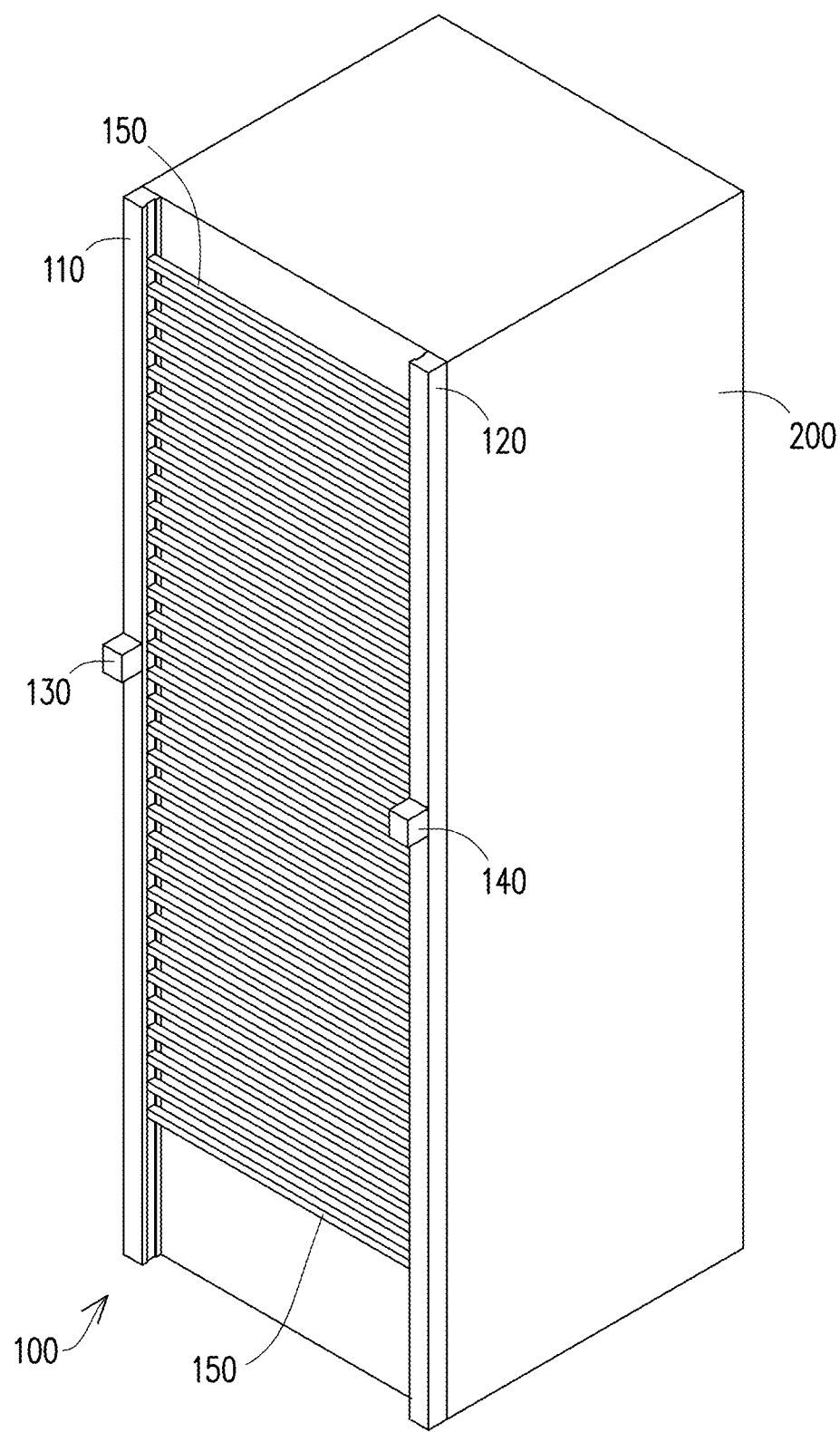
FIG. 2 is a schematic view of a rack system according to a first embodiment of the disclosure.

FIG. 2 is a schematic view of a rack system according to a first embodiment of the disclosure. Referring to FIG. 2, the rack system includes a rack 200 and a fluid distribution apparatus 100. The fluid distribution apparatus 100 is installed on one side of the rack 200. In this embodiment, both the inlet 130 and the outlet 140 are vertically provided at the first fluid conveying pipe 110 and the second fluid conveying pipe 120, respectively. Both the inlet 130 and the outlet 140 are symmetrically disposed between the two adjacent fluid manifolds 150.

Figure 3:
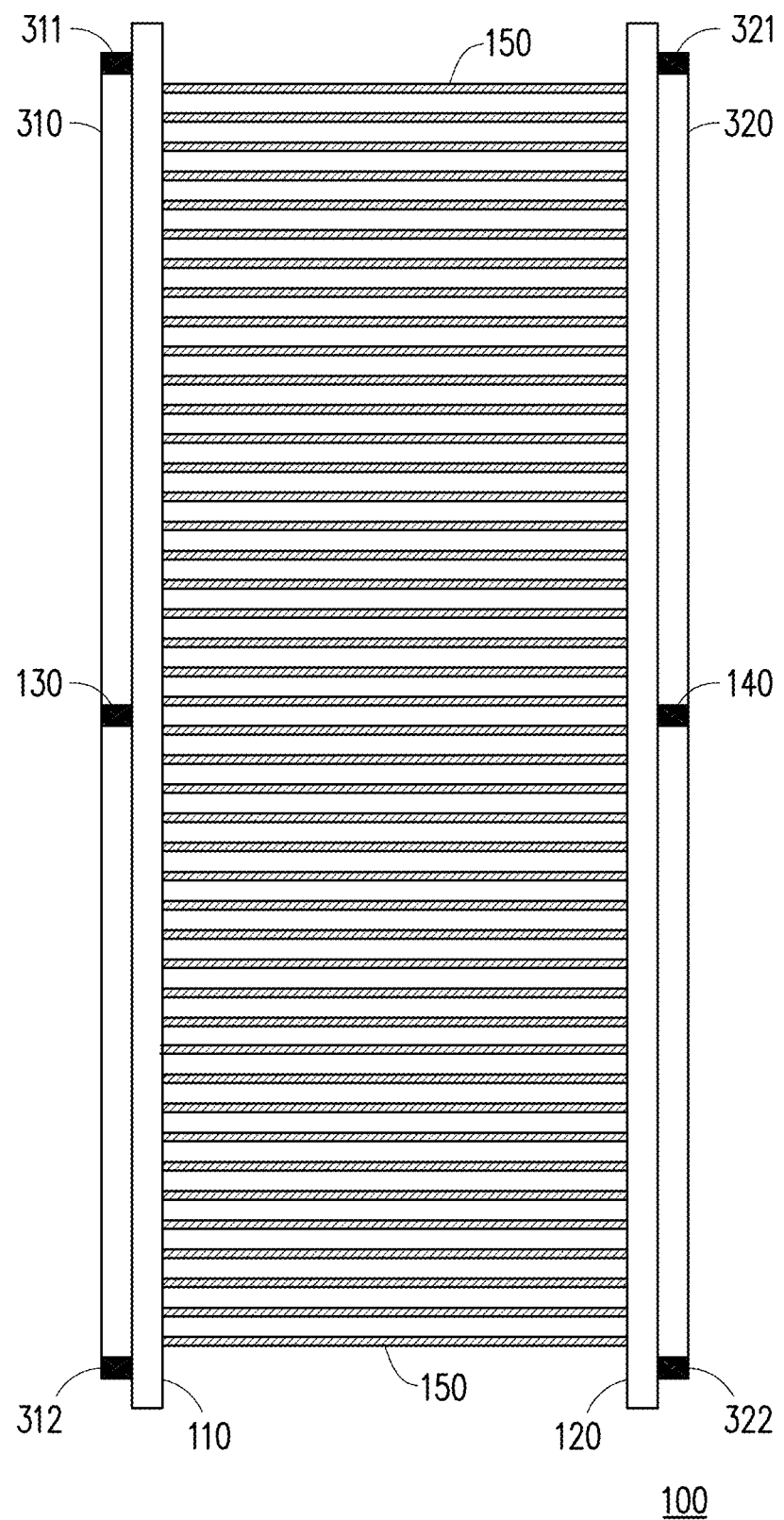
FIG. 3 is a schematic view of a fluid distribution apparatus according to a second embodiment of the disclosure.
Figure 4:
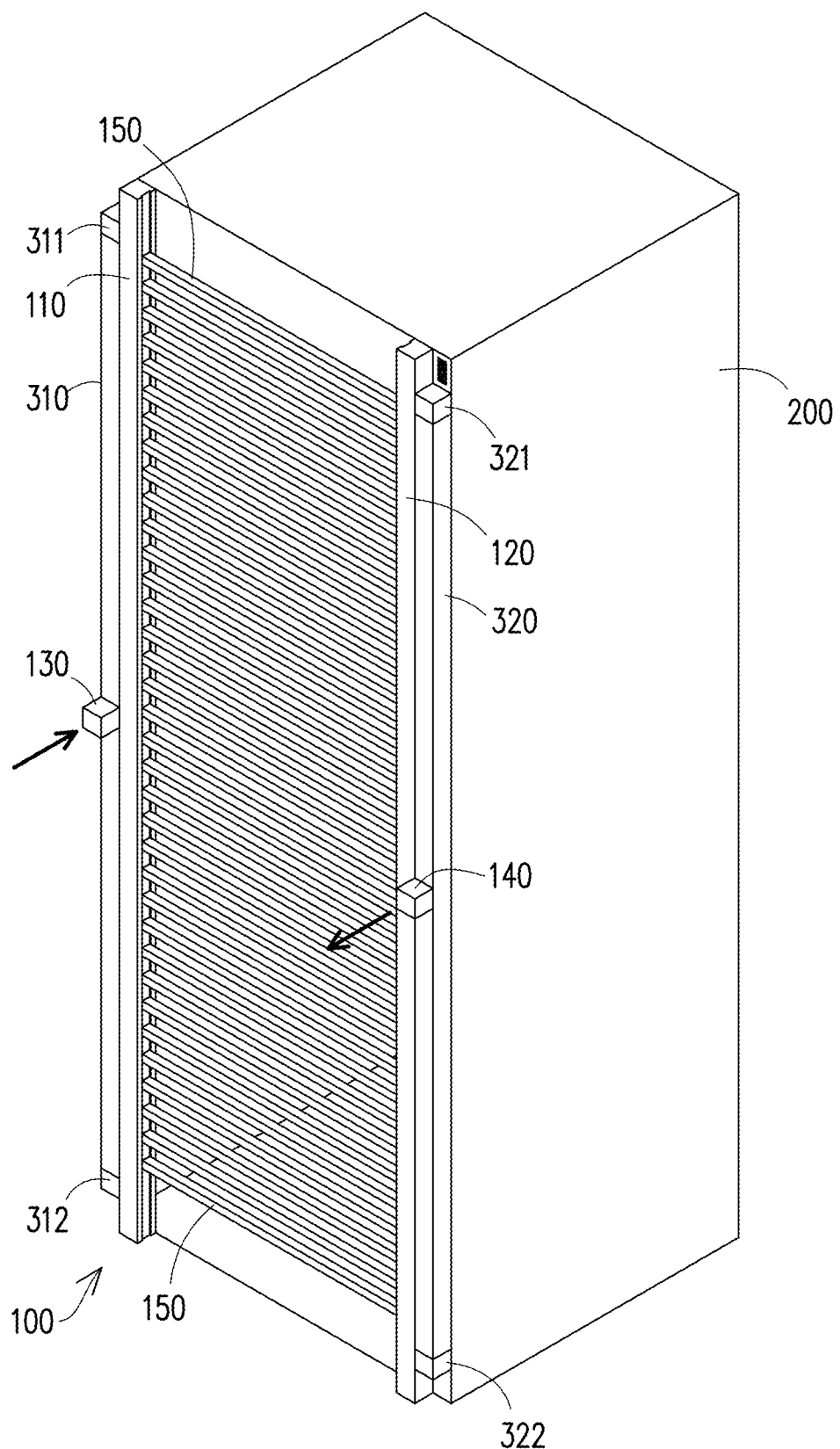
FIG. 4 is a schematic view of a rack system according to a second embodiment of the disclosure.
Figure 5:
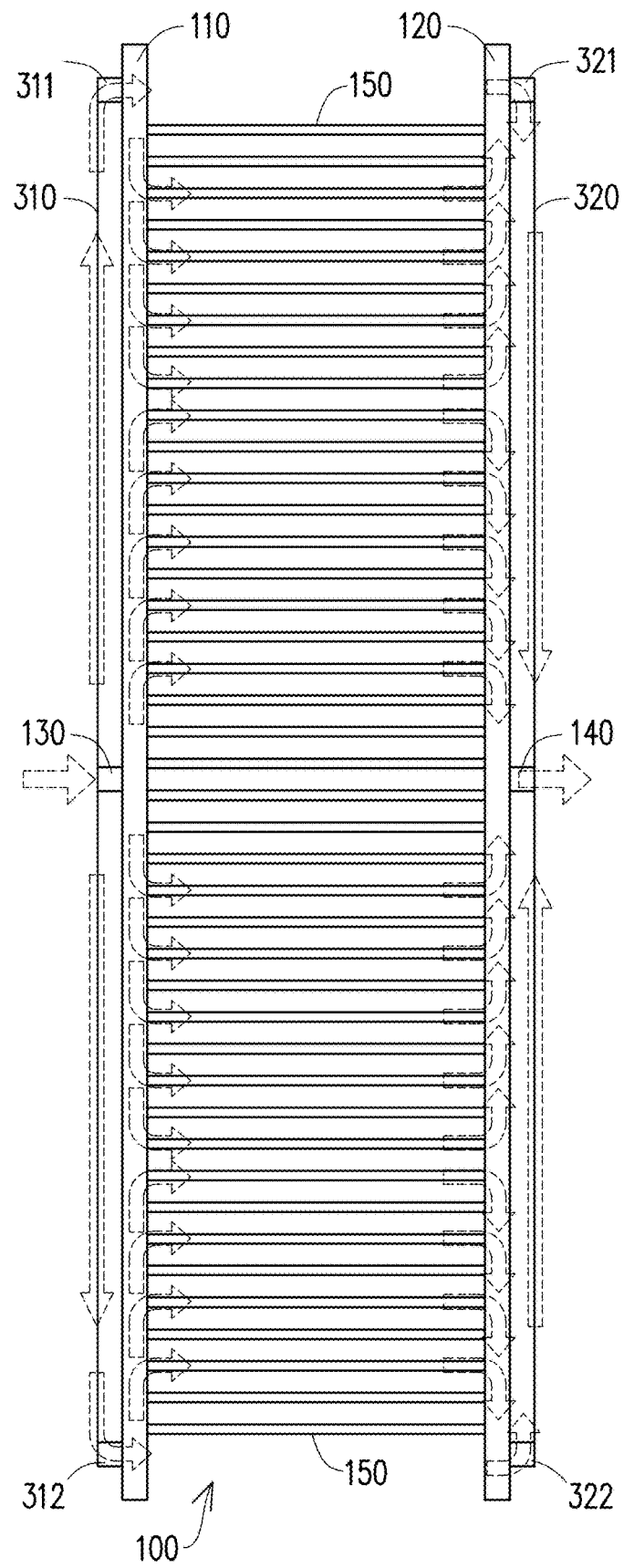
FIG. 5 is a schematic view of a fluid flow direction according to the second embodiment of the disclosure.

FIG. 3 is a schematic view of a fluid distribution apparatus according to a second embodiment of the disclosure. FIG. 4 is a schematic view of a rack system according to the second embodiment of the disclosure. FIG. 5 is a schematic view of a fluid flow direction according to the second embodiment of the disclosure. This embodiment is an application example of the first embodiment.

Please refer to FIG. 3 to FIG. 5, the fluid distribution apparatus 100 further includes an inflow guiding device 310 and an outflow guiding device 320. The fluid distribution apparatus 100 is installed on one side of the rack 200.

The inflow guiding device 310 is provided with an inlet 130, and includes first flow-guiding holes 311 and 312. The outflow guiding device 320 is provided with an outlet 140, and includes second flow-guiding holes 321 and 322. Here, the first flow-guiding hole 311 and the second flow-guiding hole 321 are disposed at an upper position and higher than the position of the first fluid manifold 150. The first flow-guiding hole 312 and the second flow-guiding hole 322 are disposed at a lower position and lower than the position of the last fluid manifold 150.

The first flow-guiding holes 311 and 312 are respectively connected with the first fluid conveying pipe 110, and the fluid flowing in from the inlet 130 flows into the first fluid conveying pipe 110 through the first flow-guiding holes 311 and 312, respectively. The second flow-guiding holes 321 and 322 are respectively connected with the second fluid conveying pipe 120, and the fluid flowing out of the second fluid conveying pipe 120 flows into the outlet 140 through the second flow-guiding holes 321 and 322, respectively.

In addition, the first flow-guiding hole may also be provided at the inlet 130 of the inflow guiding device 310 to be connected with the first fluid conveying pipe 110, so that the fluid flowing in from the inlet 130 not only can flow into the first fluid conveying pipe 110 through the first flow-guiding holes 311 and 312 respectively, but also can directly flow into the first fluid conveying pipe 110 (as shown in FIG. 5). The second flow-guiding hole may also be provided at the outlet 140 of the outflow guiding device 320 to be connected with the second fluid conveying pipe 120, so that the fluid flowing out from the second fluid conveying pipe 120 not only can flow into the outlet 140 through the second flow-guiding holes 321 and 322 respectively, but also can directly flow into the outlet 140 (as shown in FIG. 5).

Here, the disclosure provides no limitation to the number of the first flow-guiding holes and the second flow-guiding holes, and in other embodiments, more first flow-guiding holes and second flow-guiding holes may be provided.

Figure 6:
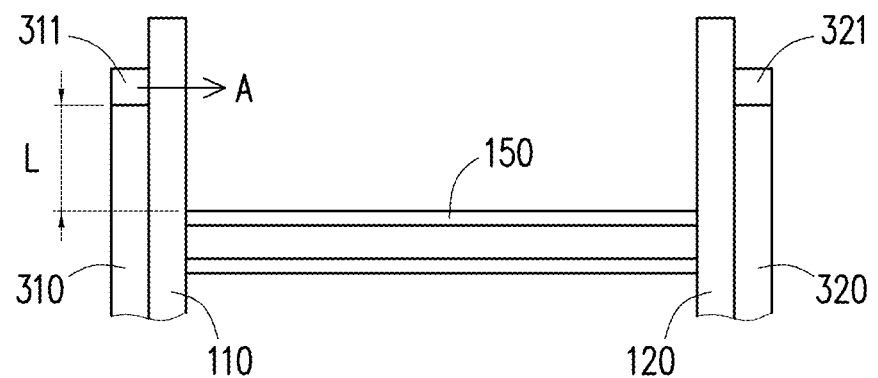
FIG. 6 is a partially enlarged schematic view of a fluid distribution apparatus according to the second embodiment of the disclosure.

FIG. 6 is a partially enlarged schematic view of a fluid distribution apparatus according to the second embodiment of the disclosure. Referring to FIG. 6, the inner diameter dimension of the fluid manifold 150 is defined as D. Here, the distance L between the first flow-guiding hole 311 and the second flow-guiding hole 321 and the uppermost fluid manifold 150 is respectively set to be larger than or equal to 5D. In addition, the distance between the first flow-guiding hole 312 and the second flow-guiding hole 322 and the lowest fluid manifold 150 is respectively also set to be larger than or equal to 5D.

In order to prevent the excessively fast flow rate from causing the anticorrosive coating in the fluid manifold 150 to peel off, the flow rate in the pipe should be less than 1.5 m/s. Based on this, the total flow Q of the fluid should be less than or equal to $9 \times 10^4 \times A$ (unit: LPM (liter per minute)), wherein A is the cross-sectional area of the inflow guiding device 310, and the unit is m². Based on the above, the cross-sectional area A of the inflow guiding device 310 has to be larger than or equal to $Q/(9 \times 10^4) m^2$. According to this formula, if the average flow is less than or equal to 2 LPM and the flow rate of the inflow guiding device 310 does not exceed 1.5 m/s, then the cross-sectional area A of the inflow guiding device 310 has to be larger than or equal to 930 mm².

Figure 7:
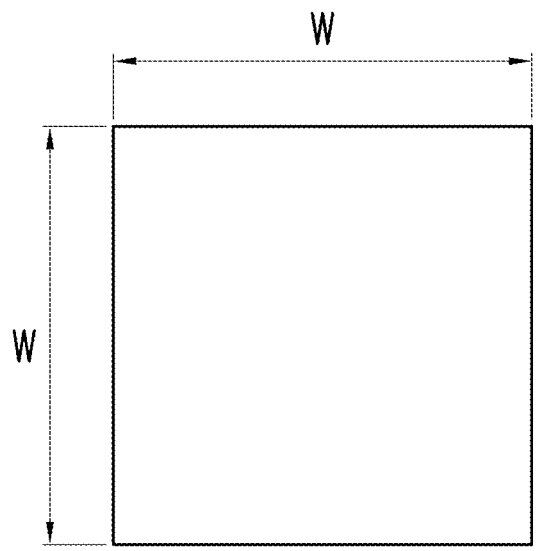
FIG. 7 is a schematic view of a cross section of an inflow guiding device according to the second embodiment of the disclosure.

FIG. 7 is a schematic view of a cross section of an inflow guiding device according to the second embodiment of the disclosure. As shown in FIG. 7, the side length of the cross section of the main pipe (inflow guiding device 310 and outflow guiding device 320) is W, and the cross-sectional area of the outflow guiding device 320 is $A \geq W^2$. If the fluid manifold 150 is selected from common two-way pipe (with outer diameter of 8 mm and inner diameter of 6 mm), the side length W has to be larger than or equal to 30 mm. That is, W≥5D. Based on the above, it can be derived that A≥(5D)².

Figure 8:
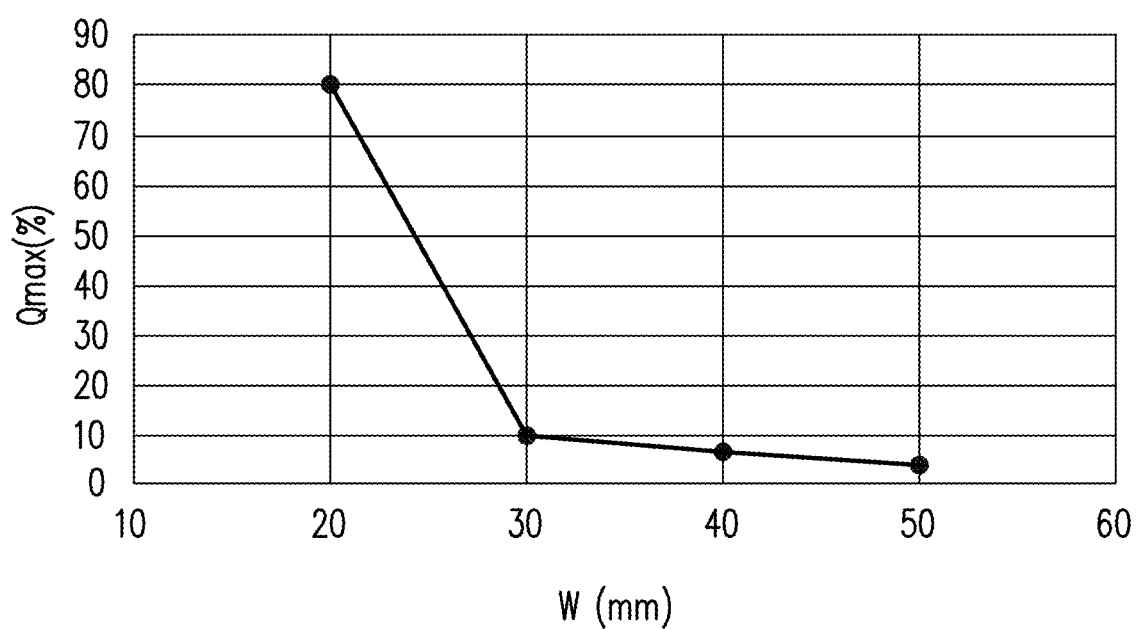
FIG. 8 is a distribution diagram of the relationship between the side length of the cross-section and the maximum absolute error percentage of the average flow according to the second embodiment of the disclosure.

FIG. 8 is a distribution diagram of the relationship between the side length of the cross-section and the maximum absolute error percentage of the average flow according to the second embodiment of the disclosure. As shown in FIG. 8, at a fixed total flow of 84 LPM (average flow is 2 LPM), change the cross-sectional area W² and compare the maximum absolute error percentage (Qmax %) of the average flow. As can be seen from FIG. 8, when the cross-sectional area A becomes larger to 30×30 mm², the maximum absolute error percentage of the average flow in the fluid manifold 150 drops significantly to a range within 10%. As the cross-sectional area A increases, the maximum absolute error percentage also declines, but the decline gradually slows down.

At present, in a common 42U rack on the market, the number of fluid manifold 150 is 42, and the average flow of each of the fluid manifolds 150 (total flow 42 LPM divided by 42) is about 1 LPM or less. Therefore, if the average flow range of the fluid manifold 150 satisfies 2 LPM or less, the error between the flow rate in each of the fluid manifolds 150 and the average flow rate is within 10%, and has to satisfy that the average flow rate in the main pipe (inflow guiding device 310, outflow guiding device 320) is less than 1.5 m/s. Therefore, the cross-sectional area A of the outflow guiding device 320 is preferably set to be larger than or equal to (5D)². Here, D is the inner diameter dimension of the fluid manifold 150. When the inner diameter dimension D of the fluid manifold 150 is 6 mm, the cross-sectional area A of the inlet 130, the outlet 140, the inflow guiding device 310, and the outflow guiding device 320 should be larger than or equal to 930 mm². The above-mentioned embodiments can effectively improve the problem of uneven flow.

Figure 9:
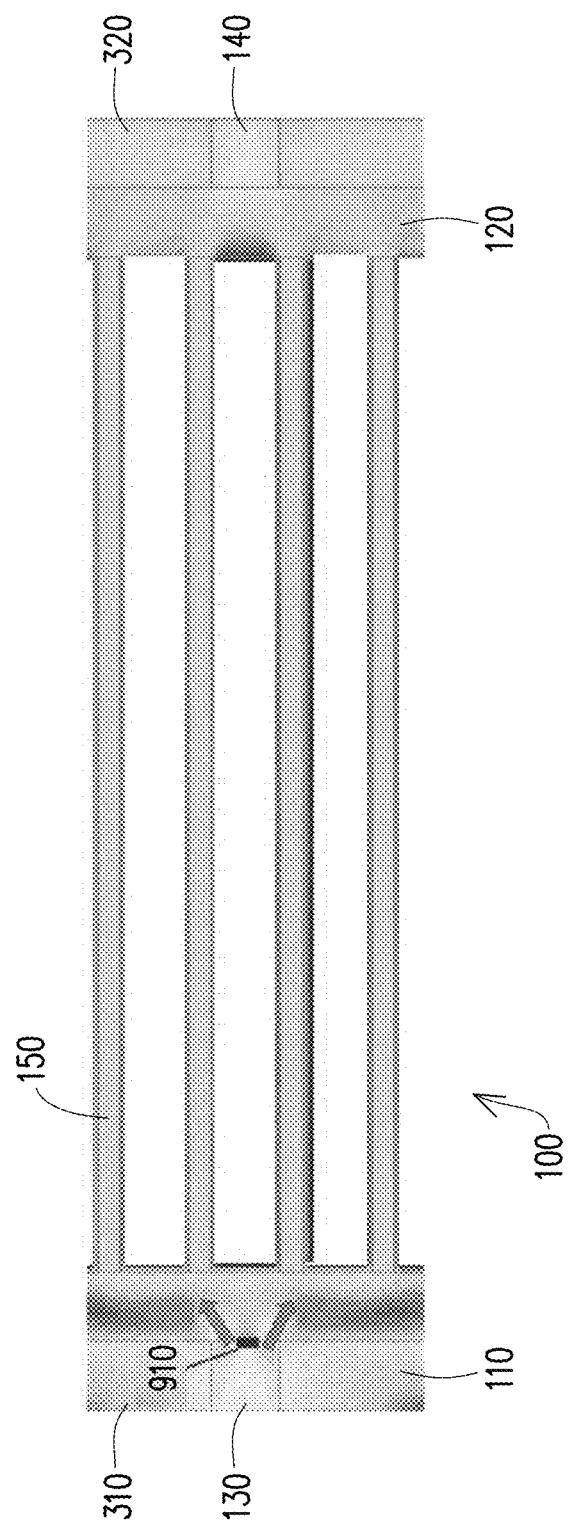
FIG. 9 is a schematic view of a fluid distribution apparatus according to a third embodiment of the disclosure.

FIG. 9 is a schematic view of a fluid distribution apparatus according to a third embodiment of the disclosure. This embodiment is an application example of the second embodiment. Referring to FIG. 9, the fluid distribution apparatus 100 may further include a baffle 910. The baffle 910 is disposed at the inlet 130, and the flow is diverged through the baffle 910, thereby reducing the flow rate of the fluid. In addition, the baffle 910 may also be provided at the inlet 130 in the fluid distribution apparatus 100 of the first embodiment.

Figure 10:
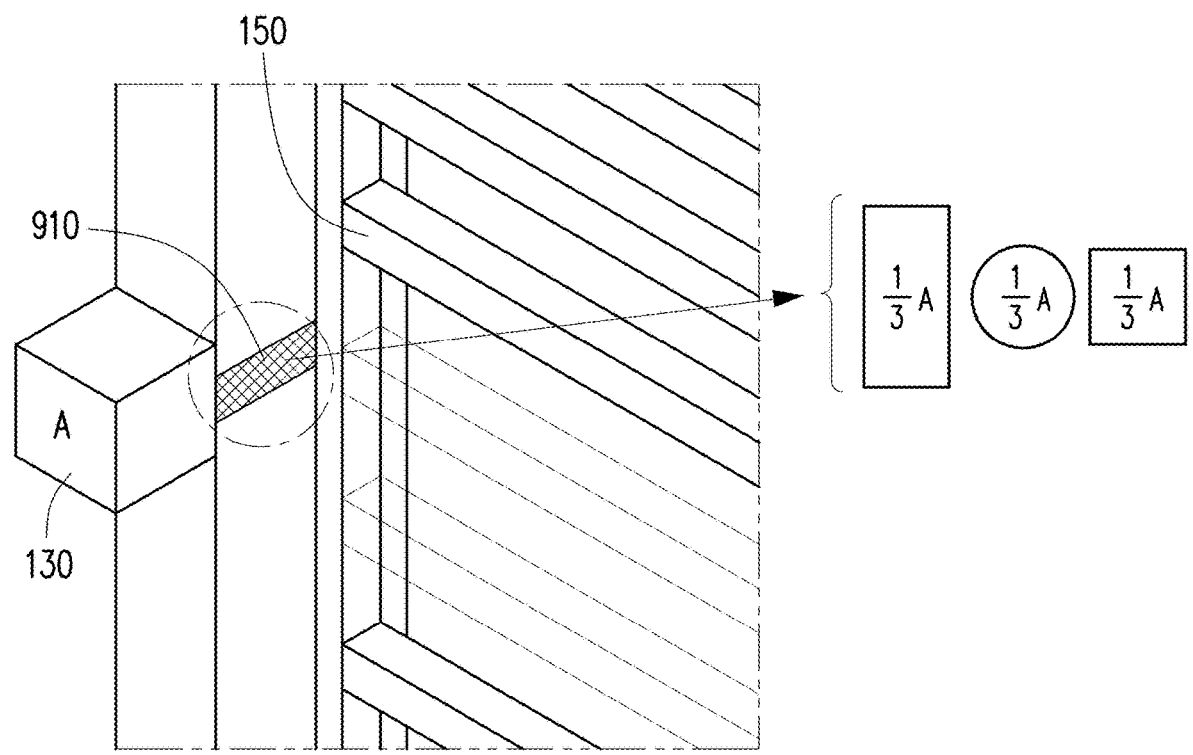
FIG. 10 is a schematic view of the installation of the baffle according to the third embodiment of the disclosure.

FIG. 10 is a schematic view of the installation of the baffle according to the third embodiment of the disclosure. Referring to FIG. 10, the area of the inlet 130 is defined as A, and the area of the baffle 910 is preferably one third of the inlet 130, that is, ⅓A. Therefore, any baffle 910 with an area satisfying this formula is applicable, and the disclosure provides no limitation to the shape of the baffle 910. For example, the shape of baffle 910 may be rectangular, circular, square, or the like.

The following is a flow distribution comparison between the embodiment in which the inlet 130 and the outlet 140 are provided at the bottom (bottom-in and bottom-out) and the embodiment in which the inlet 130 and the outlet 140 are disposed in the middle (middle-in and middle-out).

Figure 11:
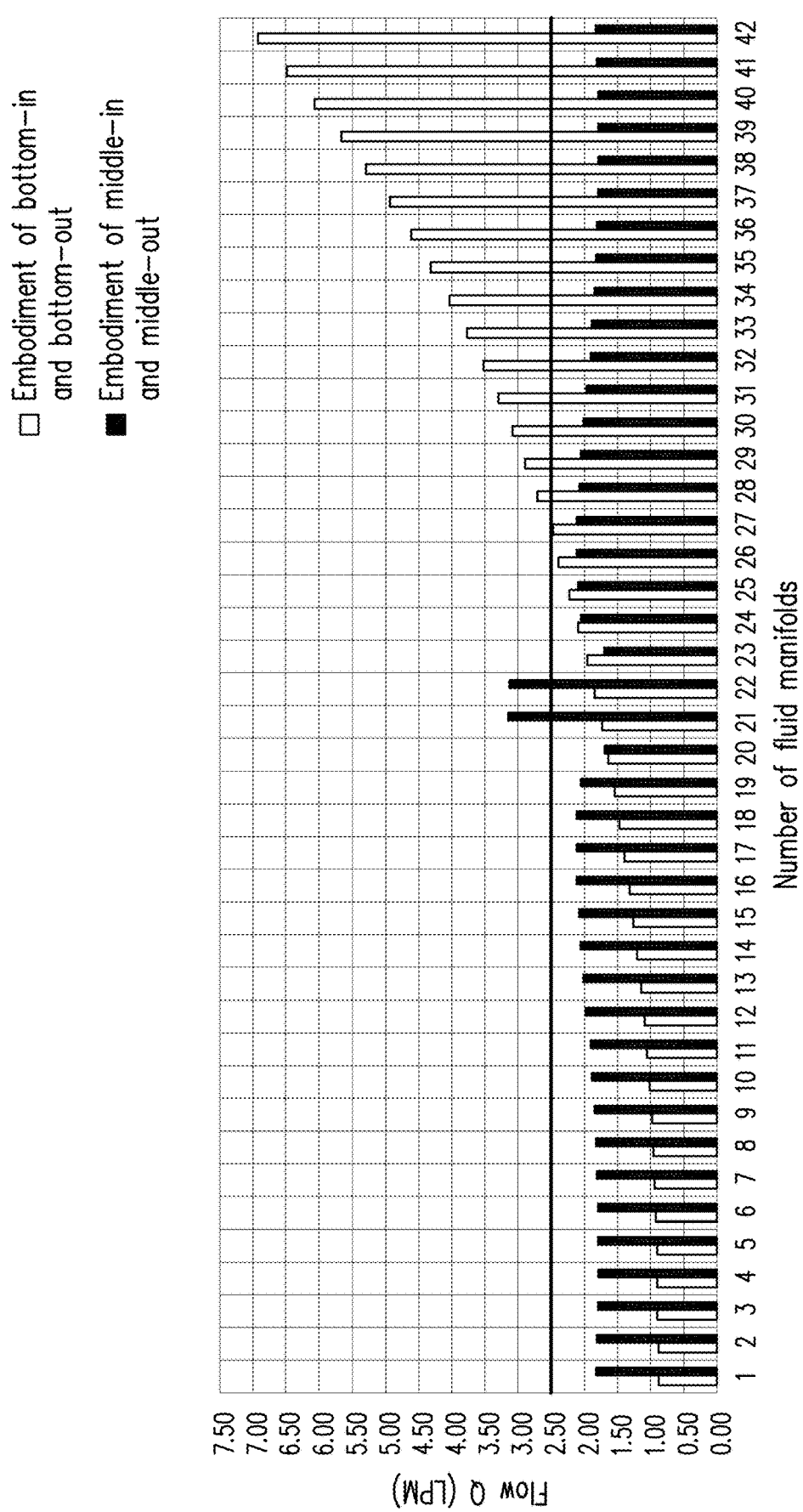
FIG. 11 is a histogram of flow distribution comparison in absence of baffle according to an embodiment of the disclosure.
Figure 12:
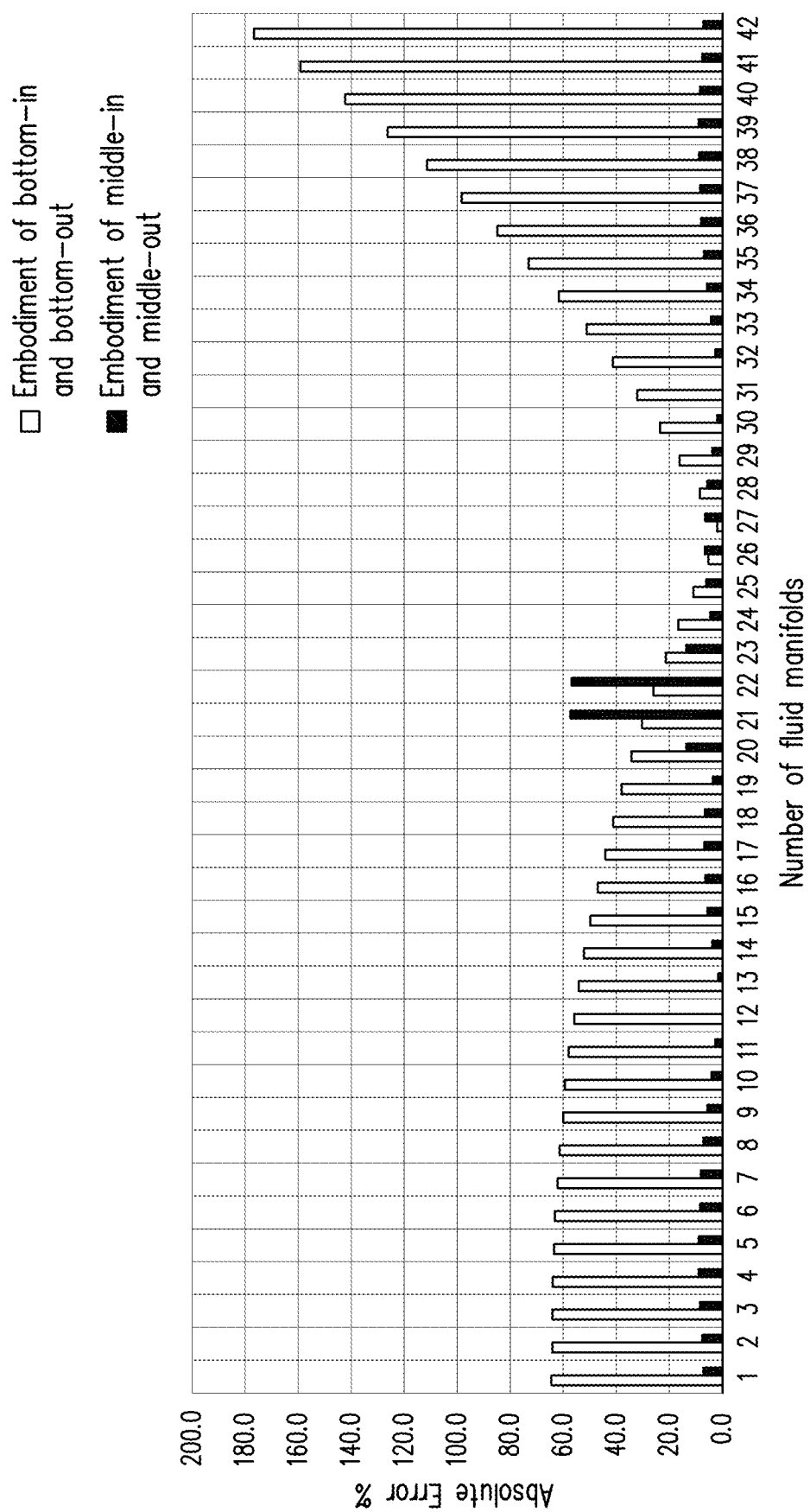
FIG. 12 is a histogram of the absolute error of FIG. 11.

FIG. 11 is a histogram of flow distribution comparison in absence of baffle according to an embodiment of the disclosure. FIG. 12 is a histogram of the absolute error of FIG. 11. The horizontal axis in FIG. 11 and FIG. 12 represents the number of fluid manifold, the vertical axis in FIG. 11 represents the flow Q, and the vertical axis in FIG. 12 represents the absolute error. FIG. 12 is a histogram obtained by subtracting the ideal flow 2.5 (unit: LPM) from the value of the flow Q in the histogram of FIG. 11, obtaining an absolute value, and dividing by the average value of flow. Here, the white bar represents an embodiment in which both the inlet and the outlet are provided at the bottom (bottom-in and bottom-out), and the black bar represents an embodiment of the fluid distribution apparatus in which both the inlet and outlet are provided in the middle (middle-in and middle-out). FIG. 11 and FIG. 12 clearly show that the flow of each of the fluid manifolds 150 in the middle-in and middle-out embodiment is uniform, while in the bottom-in and bottom-out embodiment, the closer to the lower portion (with larger fluid manifold number), the greater of the flow of the fluid manifold 150, and the closer to the upper portion (with smaller fluid manifold number), the less of the flow of the fluid manifold 150.

Figure 13:
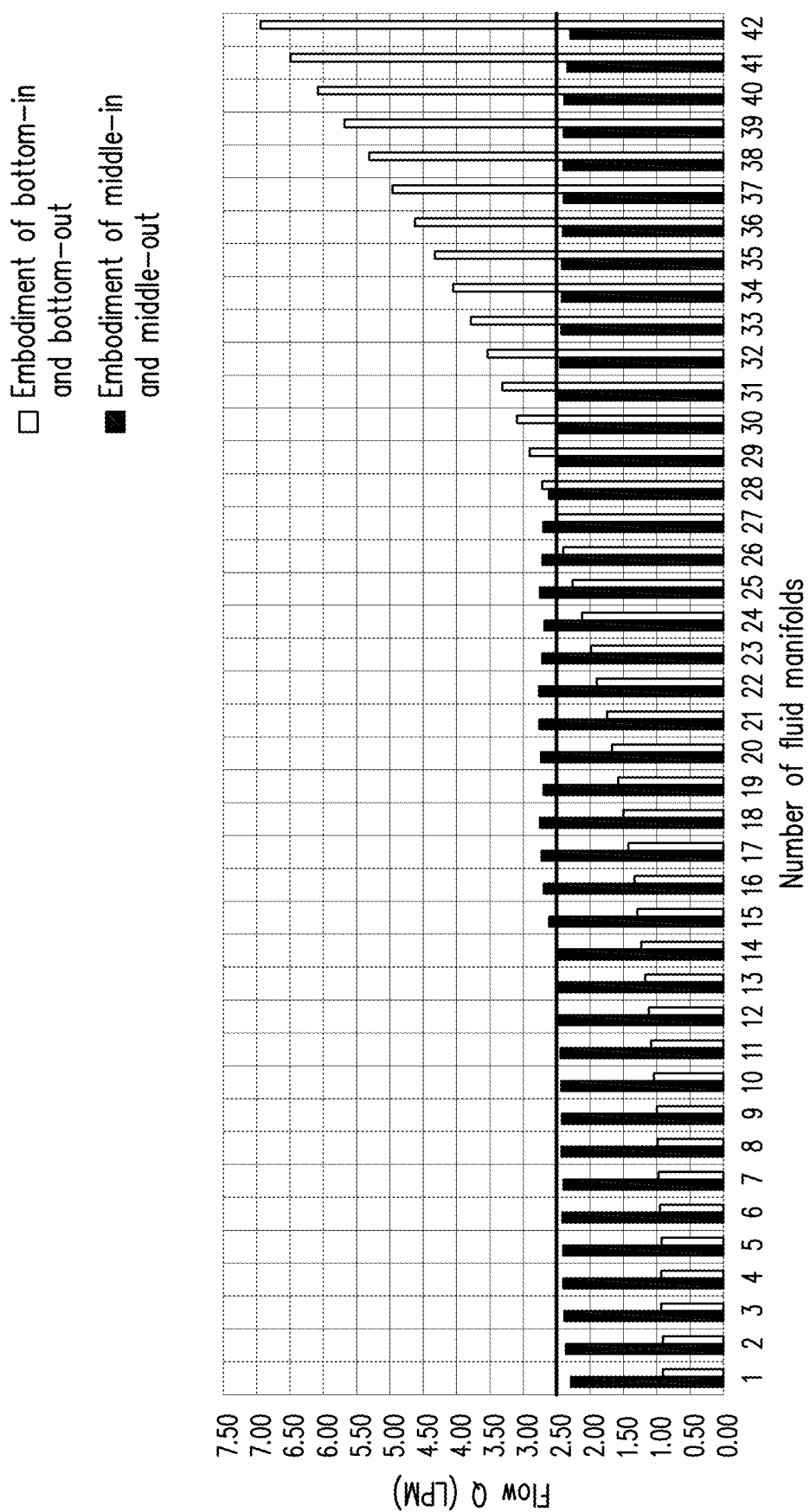
FIG. 13 is a histogram of flow distribution comparison in the presence of baffle according to an embodiment of the disclosure.
Figure 14:
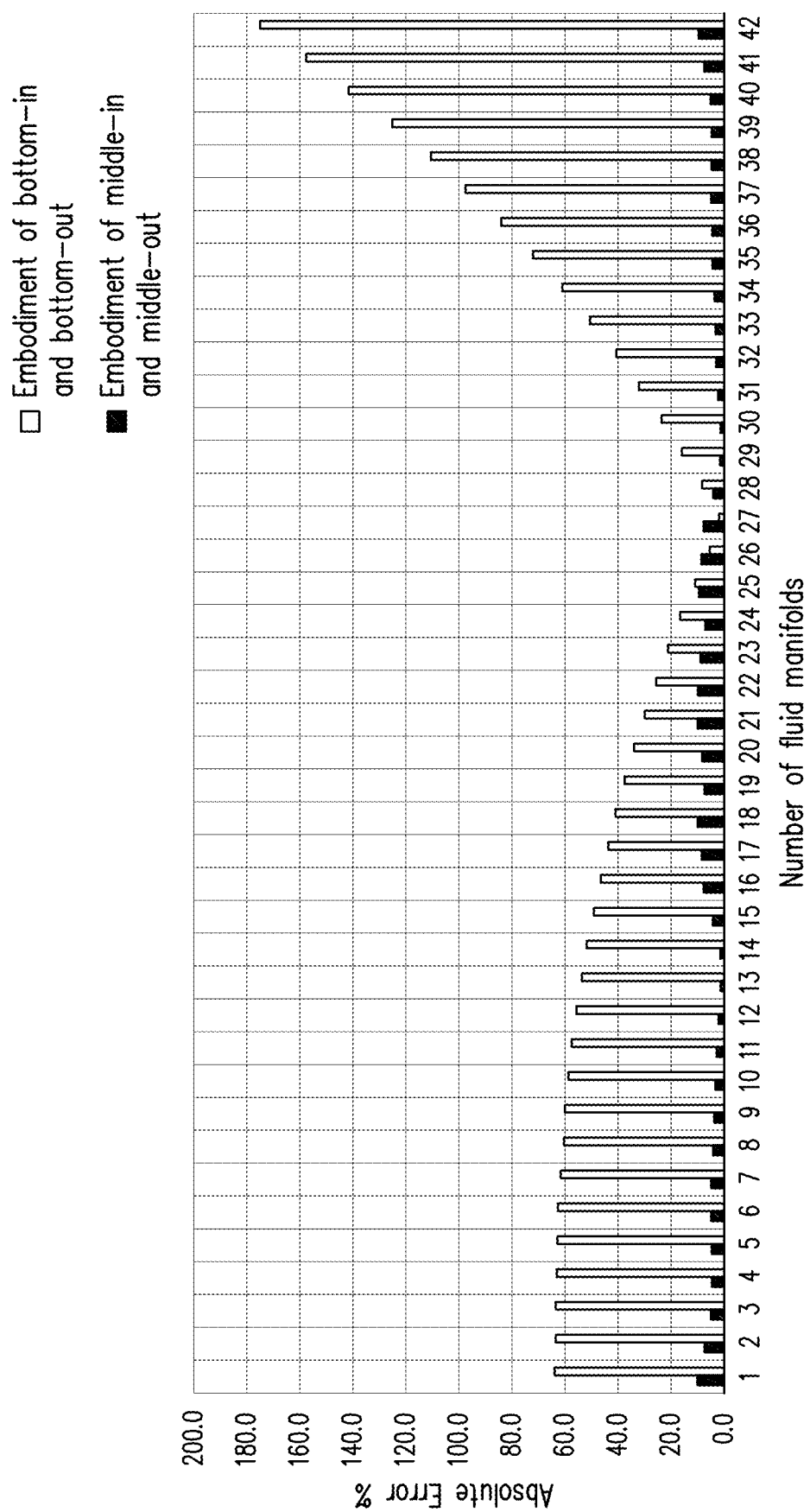
FIG. 14 is a histogram of the absolute error of FIG. 13.

FIG. 13 is a histogram of flow distribution comparison in the presence of baffle according to an embodiment of the disclosure. FIG. 14 is a histogram of the absolute error of FIG. 13. The horizontal axis in FIG. 13 and FIG. 14 represents the number of fluid manifold, the vertical axis in FIG. 13 represents the flow Q, and the vertical axis in FIG. 14 represents the absolute error. FIG. 14 is a histogram obtained by subtracting the ideal flow 2.5 (unit: LPM) from the value of the flow in the histogram of FIG. 13, obtaining an absolute value, and dividing by the average value of flow. Here, the white bar represents an embodiment in which both the inlet and the outlet are provided at the bottom (bottom-in and bottom-out), and the black bar represents an embodiment of the fluid distribution apparatus in which both the inlet and the outlet are provided in the middle (middle-in and middle-out).

In the examples of FIG. 11 to FIG. 14, the inlet 130 is provided between the fluid manifolds no. 21 and no. 22. When the fluid distribution apparatus 100 is not provided with the baffle 910, as shown by the black bar in FIG. 11, among the fluid manifolds no. 1 to no. 42, only the fluid manifolds no. 21 and no. 22 have a flow higher than the ideal flow 2.5 LPM, and the flow of fluid manifolds denoted by other numbers is lower than the ideal flow 2.5 LPM. In other words, the absolute errors of the fluid manifolds no. 21 and no. 22 are much higher than the absolute errors of fluid manifolds of other numbers (as shown by the black bars in FIG. 12).

On the other hand, when the fluid distribution apparatus 100 is provided with the baffle 910, as shown by the black bar in FIG. 13, the flow of respective fluid manifolds no. 1 to no. 42 is close to the ideal flow 2.5 LPM. Referring to the black bar in FIG. 14, the absolute errors of respective fluid manifolds no. 1 to no. 42 will be within a threshold (for example, 10%).

Based on this, it can be clearly seen from FIG. 11 to FIG. 14 that by setting the baffle 910 at the inlet 130, it is possible to further make the difference between the flow of respective fluid manifolds 150 and the average flow smaller than a threshold (e.g. 10%), which can effectively reduce the flow of the fluid manifolds no. 21 and no. 22 corresponding to the position of the inlet 130.

In addition, in other embodiments, a fluid distribution module with choke is provided. The fluid distribution module includes a fluid conveying pipe, at least two fluid manifolds, and a choke. The fluid conveying pipe is connected to the at least two fluid manifolds and the choke respectively. The fluid distribution module further includes an inlet. The inlet is provided on a side of the fluid conveying pipe and located between both ends of the fluid conveying pipe. Fluid is supplied from the inlet to the fluid conveying pipe, and the fluid is delivered to the at least two fluid manifolds along the fluid conveying pipe. The choke is provided at the inlet to reduce the flow of the fluid. The choke is, for example, a baffle, and its shape is one of a rectangular, a circular, and a square shape.

In summary, the above-mentioned embodiments solve the problem of large difference in flow at different outlet positions of the existing flow distribution apparatus, and can achieve the effect that the difference in flow distribution is less than 10%. Moreover, the above-mentioned embodiments utilize a simple mechanism design to solve the problem of flow distribution, which conforms to the principle of easy manufacturing. Accordingly, it is possible to prevent the cooling distribution unit (CDU) from providing excessively high pressure or flow due to uneven flow distribution. In other words, energy consumption can be reduced, that is, the purpose of energy saving can be achieved. For a data center that needs to consume a lot of energy, the purpose of energy saving can be attained, that is, to reduce power usage efficiency (PUE). Since the uneven fluid flow will impact on the heat dissipation effect, the above embodiments solve the problem of uneven fluid flow, which certainly improves the heat dissipation effect. In addition, through the installation of baffles, the problem of excessively fast flow rate at the inlet can be further solved.

What is claimed is:

1. A fluid distribution apparatus, comprising:
   a first fluid conveying pipe;
   a second fluid conveying pipe;
   a plurality of fluid manifolds respectively located between the first fluid conveying pipe and the second fluid conveying pipe, and respectively connected with the first fluid conveying pipe and the second fluid conveying pipe;
   an inflow guiding device comprising a plurality of first flow-guiding holes, wherein the inflow guiding device is arranged on an outside of the first fluid conveying pipe, and the plurality of first flow-guiding holes are respectively connected with the first fluid conveying pipe;
   an inlet provided on the inflow guiding device and located between both ends of the first fluid conveying pipe; and
   an outlet provided on a side of the second fluid conveying pipe, and disposed corresponding to a position where the inlet is provided,
   wherein, a fluid flowing in from the inlet directly flows into the first fluid conveying pipe through the plurality of first flow-guiding holes respectively, the fluid flowing into the first fluid conveying pipe is delivered to the plurality of fluid manifolds along the first fluid conveying pipe, the fluid flowing into the plurality of fluid manifolds flows into the second fluid conveying pipe and flows out from the outlet.

2. The fluid distribution apparatus according to claim 1, wherein the fluid distribution apparatus is installed on one side of a rack, and the inlet is located between two adjacent fluid manifolds.

3. The fluid distribution apparatus according to claim 1, wherein the fluid distribution apparatus is installed on one side of a rack, and the fluid distribution apparatus further comprises:
   an outflow guiding device provided with the outlet and comprising a plurality of second flow-guiding holes, wherein the outflow guiding devices arranged on an outside of the second fluid conveying pipe, the plurality of second flow-guiding holes are respectively connected with the second fluid conveying pipe, and the fluid flowing out from the second fluid conveying pipe directly flows into the outlet through the plurality of second flow-guiding holes respectively.

4. The fluid distribution apparatus according to claim 3, wherein the number of the plurality of second flow-guiding holes is at least three, which are respectively disposed at both ends of the second fluid conveying pipe and at a position between the both ends.

5. The fluid distribution apparatus according to claim 3, wherein one of the plurality of first flow-guiding holes adjacent to the uppermost fluid manifold and one of the plurality of second flow-guiding holes adjacent to the uppermost fluid manifold are respectively spaced apart from the uppermost fluid manifold at a distance larger than or equal to 5D, wherein D is an inner diameter dimension of the fluid manifold.

6. The fluid distribution apparatus according to claim 3, wherein one of the plurality of first flow-guiding holes adjacent to the lowest fluid manifold and one of the plurality of second flow-guiding holes adjacent to the lowest fluid manifold are respectively spaced apart from the lowest fluid manifold at a distance larger than or equal to 5D, wherein D is an inner diameter dimension of the fluid manifold.

7. The fluid distribution apparatus according to claim 1, wherein the number of the plurality of first flow-guiding holes is at least three, which are respectively disposed at both ends of the first fluid conveying pipe and at a position between the both ends.

8. The fluid distribution apparatus according to claim 1, wherein a cross-sectional area A of the inflow guiding device and the outflow guiding device each is larger than or equal to (5D)2, and D is an inner diameter dimension of the fluid manifold.

9. The fluid distribution apparatus according to claim 1, wherein a first end of each of the plurality of fluid manifolds is connected with the first fluid conveying pipe, and a second end of each of the plurality of fluid manifolds is connected with the second fluid conveying pipe.

10. The fluid distribution apparatus according to claim 1, further comprising:
    a baffle provided at the inlet to reduce a flow rate of the fluid.

11. The fluid distribution apparatus according to claim 10, wherein the baffle has a shape of one of a rectangle, a circle, and a square.

12. The fluid distribution apparatus according to claim 10, wherein an area of the baffle is one third of an area of the inlet.

13. A fluid distribution module with choke, comprising:
    a fluid conveying pipe;
    at least two fluid manifolds;
    a choke; and
    an inflow guiding device comprising a plurality of first flow-guiding holes, wherein the inflow guiding device is arranged on an outside of the fluid conveying pipe, and the plurality of first flow-guiding holes are respectively connected with the fluid conveying pipe;
    wherein, the fluid conveying pipe is connected to the at least two fluid manifolds and a pipeline of the choke respectively,
    a fluid flowing in from the inlet directly flows into the fluid conveying pipe through the plurality of first flow-guiding holes respectively, the fluid flowing into the fluid conveying pipe is delivered to the plurality of fluid manifolds along the fluid conveying pipe.

14. The fluid distribution module according to claim 13, wherein:

the inlet is located between both ends of the fluid conveying pipe, the choke is provided at the inlet to reduce a flow rate of the fluid.

15. The fluid distribution module according to claim 13, wherein a shape of the choke is one of a rectangle, a circle, and a square.

\* \* \* \* \*